(12) United States Patent
Mumtaz et al.

(10) Patent No.: US 8,405,248 B2
(45) Date of Patent: Mar. 26, 2013

(54) POWER SUPPLY CIRCUITS

(75) Inventors: Asim Mumtaz, Cambridge (GB); Lesley Chisenga, Cambridge (GB); Gehan Anil Joseph Amaratunga, Cambridge (GB)

(73) Assignee: Enecsys Limited, Cambridge (GB)

( * ) Notice: Subject to any disclaimer, the term of this patent is extended or adjusted under 35 U.S.C. 154(b) by 63 days.

(21) Appl. No.: 12/793,068

(22) Filed: Jun. 3, 2010

(65) Prior Publication Data

US 2010/0264736 A1    Oct. 21, 2010

Related U.S. Application Data

(62) Division of application No. 10/555,803, filed on Feb. 16, 2007, now Pat. No. 8,067,855.

(60) Provisional application No. 60/505,842, filed on Sep. 26, 2003.

(30) Foreign Application Priority Data

May 6, 2003   (GB) .................................. 0310362.9

(51) Int. Cl.
*H02J 1/00* (2006.01)
(52) U.S. Cl. ......................................................... 307/66
(58) Field of Classification Search .................. 307/66, 307/147; 257/335, 141
See application file for complete search history.

(56) References Cited

U.S. PATENT DOCUMENTS

| | | | |
|---|---|---|---|
| 4,412,142 A | 10/1983 | Ragonese et al. |
| 4,626,983 A | 12/1986 | Harada et al. |
| 4,631,565 A | 12/1986 | Tihanyi |
| 4,951,117 A | 8/1990 | Kasai |
| 5,138,422 A | 8/1992 | Fujii et al. |
| 5,237,194 A | 8/1993 | Takahashi |
| 5,412,558 A | 5/1995 | Sakurai et al. |
| 5,413,313 A | 5/1995 | Mutterlein et al. |
| 5,539,238 A | 7/1996 | Malhi |
| 5,677,833 A | 10/1997 | Bingley |
| 5,703,390 A | 12/1997 | Itoh |
| 5,731,603 A | 3/1998 | Nakawaga et al. |

(Continued)

FOREIGN PATENT DOCUMENTS

| AU | 200020738 A1 | 9/2000 |
|---|---|---|
| AU | 5868700 | 1/2001 |

(Continued)

OTHER PUBLICATIONS

Nakai, et al: "*A Novel Grid Interface for Photovoltaic, Wind-Electric, and Fuel-Cell Systems with a Controllable Power Factor or Operation*"; IEEE, 1995, pp. 995-998.

(Continued)

*Primary Examiner* — Daniel Cavallari
(74) *Attorney, Agent, or Firm* — Adeli & Tollen LLP

(57) ABSTRACT

This invention is generally concerned with power supply circuits, and more particularly, with circuits to supply power to a mains supply, such as domestic grid mains, from a photovoltaic device. A photovoltaic power conditioning circuit for providing power from a photovoltaic device to an alternating current mains power supply line, the circuit comprising: a DC input to receive DC power from said photovoltaic device; an AC output configured for direct connection to said AC mains power supply line; a DC-to-AC converter coupled to said DC input and to said AC output to convert DC power from said photovoltaic device to AC power for output onto said power supply line; and an electronic controller directly coupled to said power supply line to measure a voltage of said power supply line and a current in said supply line and to control said DC-to-AC converter responsive to said measuring.

12 Claims, 8 Drawing Sheets

U.S. PATENT DOCUMENTS

| | | | |
|---|---|---|---|
| 6,046,470 | A | 4/2000 | Williams et al. |
| 6,064,086 | A | 5/2000 | Nakagawa et al. |
| 6,130,458 | A | 10/2000 | Takagi et al. |
| 6,151,234 | A | 11/2000 | Oldenkamp |
| 6,191,456 | B1 | 2/2001 | Stoisiek et al. |
| 6,219,623 | B1 | 4/2001 | Wills |
| 6,346,451 | B1 | 2/2002 | Simpson et al. |
| 6,429,546 | B1 | 8/2002 | Ropp et al. |
| 6,472,254 | B2 | 10/2002 | Cantarini et al. |
| 6,603,672 | B1 | 8/2003 | Deng et al. |
| 6,678,174 | B2 | 1/2004 | Suzui et al. |
| 6,693,327 | B2 | 2/2004 | Priefert et al. |
| 6,768,180 | B2 | 7/2004 | Salama et al. |
| 6,933,714 | B2 | 8/2005 | Fasshauer et al. |
| 6,949,843 | B2 * | 9/2005 | Dubovsky ............ 307/64 |
| 6,950,323 | B2 | 9/2005 | Achlietner et al. |
| 7,315,052 | B2 | 1/2008 | Alter |
| 7,361,952 | B2 | 4/2008 | Miura et al. |
| 7,405,117 | B2 | 7/2008 | Zuniga et al. |
| 7,463,500 | B2 | 12/2008 | West |
| 7,482,238 | B2 | 1/2009 | Sung |
| 7,838,389 | B2 | 11/2010 | Radic et al. |
| 8,067,855 | B2 | 11/2011 | Mumtaz et al. |
| 8,077,437 | B2 | 12/2011 | Mumtaz et al. |
| 2002/0034083 | A1 | 3/2002 | Ayyanar et al. |
| 2002/0085397 | A1 | 7/2002 | Suzui et al. |
| 2003/0066555 | A1 | 4/2003 | Hui et al. |
| 2003/0080741 | A1 | 5/2003 | LeRow et al. |
| 2003/0164695 | A1 | 9/2003 | Fasshauer et al. |
| 2004/0056293 | A1 * | 3/2004 | Saito ............................. 257/296 |
| 2004/0207366 | A1 | 10/2004 | Sung |
| 2008/0266922 | A1 | 10/2008 | Mumtaz et al. |

FOREIGN PATENT DOCUMENTS

| | | |
|---|---|---|
| EP | 0521467 A2 | 1/1993 |
| EP | 0576271 A2 | 12/1993 |
| EP | 0 628 901 A2 | 12/1994 |
| EP | 0628901 A2 | 12/1994 |
| EP | 0809293 | 11/1997 |
| EP | 1 035 640 A1 | 9/2000 |
| EP | 1339153 A2 | 8/2003 |
| EP | 1239576 A3 | 7/2004 |
| EP | 1623495 | 2/2006 |
| GB | 0310362 | 5/2003 |
| JP | 61137365 | 6/1986 |
| JP | 04364378 A | 12/1992 |
| JP | 04364378 A | 12/1992 |
| JP | 07028538 A | 1/1995 |
| JP | 08227324 A | 9/1996 |
| JP | 08317664 A2 | 11/1996 |
| JP | 09046926 A | 2/1997 |
| JP | 09121046 A | 5/1997 |
| JP | 2000020150 A2 | 1/2000 |
| JP | 2000341974 A | 12/2000 |
| JP | 2000347753 A | 12/2000 |
| JP | 2001178145 A | 6/2001 |
| JP | 2002270876 A | 9/2002 |
| JP | 2002354677 A | 12/2002 |
| JP | 2002354677 A | 12/2002 |
| NL | C 1011483 | 3/1999 |
| WO | WO 00/77522 A1 | 12/2000 |
| WO | 2004053993 | 6/2004 |
| WO | WO 2004/100348 | 11/2004 |

OTHER PUBLICATIONS

Petkanchin: *"Processes Following Changes of Phase Angle Between Current and Voltage in Electric Circuits"*; Aug. 1999, Power Engineering Review, IEEE, vol. 19, Issue 8, pp. 59-60.

Portions of prosecution history of U.S. Appl. No. 10/555,803, mailed Oct. 4, 2011, Mumtaz, Asim, et al.

International Search Report for PCT/GB2004/001965, mailed Oct. 12, 2004, Enecsys Limited.

International Preliminary Report on Patentability for PCT/GB2004/001965, issued Nov. 11, 2005, Enecsys Limited.

Portions of prosecution history of EP 04731398, mailed Sep. 10, 2009, Enecsys Limited.

Amaratunga G.A., et al., "Power integrated circuits: Device and Applications," Bipolar/BiCMOS Circuits and Technology Meeting, Sep. 26-28, 1999, pp. 75-79, Piscataway, NJ, USA, IEEE.

Mumtaz, Asim, et al., "Grid Connected PV Inverter using a Commercially Available Power IC," PV in Europe Conference, Oct. 2002, Rome, Italy.

United Kingdom Search Report for GB 0310362, mailed May 6, 2006, Enecsys Limited.

* cited by examiner

POWER SUPPLY CIRCUITS

RELATED APPLICATIONS

This application is a divisional application of U.S. patent application Ser. No. 10/555,803, filed 16 Feb. 2007, now issued as U.S. Pat. No. 8,067,855. U.S. patent application Ser. No. 10/555,803 is a national stage application of PCT Application PCT/GB2004/001965, entitled "Power Supply Circuits", filed on May 6, 2004. PCT Application PCT/GB2004/001965 claims the benefit of United Kingdom Patent Application GB 0310362.9 filed May 6, 2003 and U.S. Provisional Application 60/505,842 filed Sep. 26, 2003. U.S. Pat. No. 8,067,855 is incorporated herein by reference.

TECHNICAL FIELD

This invention is generally concerned with power supply circuits, and more particularly, with circuits to supply power to a mains supply, such as domestic grid mains, from a photovoltaic device.

BACKGROUND

It is known to provide an alternating current mains supply at either 110 volts or 230/240 volts from a photovoltaic device using an inverter circuit. One standard photovoltaic (PV) panel provides approximately 20 volts DC at around 4.5 amps maximum and this voltage must be stepped up and converted to alternating current to provide a mains output. This is generally done using an inverter constructed from discrete electronic components to convert the low DC input voltage to a high AC output voltage. Alternatively, there may be an initial step to step up the DC voltage before converting it to an AC voltage. An implementation of such a basic arrangement using the Hitachi ECN 3067 integrated circuit and, optionally, the ST Microelectronics L298 integrated circuit is described in "Grid Connected PV Inverter using a Commercially Available Power IC", A. Mumtaz, N. P. van der Duijn Schouten, L. Chisenga, R. A. MacMahon and G. A. J. Amaratunga presented in October 2002 at the PV in Europe conference in Rome, Italy.

Further prior art can be found in AU 58687, U.S. Pat. No. 6,151,234, AU 2073800, EP 1035640, NL 1011483C, U.S. Pat. No. 4,626,983 A, EP 0628901 A, U.S. Pat. No. 6,603,672 B, JP 2002 354677 A and JP 4 364378 A.

In practice, supply of power to a domestic grid mains is complicated by the need to maintain the quality of supplied power within standard limits, typically determined by regulatory authorities. These may include over-current, under-voltage and over-voltage, and under-frequency and over-frequency conditions. Recommendations for the connection of photovoltaic generators of up to 5 KVA are contained in the Engineering Recommendation G77, produced by the U.K. Electricity Association. It contains details for isolation of a PV inverter from the grid if the operating voltage exceeds the 230V+10% (253V) or −10% (207V). The operating frequency should not exceed 50 Hz+1% (50.5 Hz) or 6% (47 Hz); DC current injection should not exceed 5 mA. A particularly important problem is referred to as "islanding"—that is if the domestic mains grid supply is switched off or tripped, for example to protect equipment and/or maintenance staff, then the PV inverter must also cease to supply power to the grid. According to the aforementioned recommendations the disconnection time for the PV inverter should be less than 5 seconds

SUMMARY

The present invention addresses problems associated with conditioning and control of a mains supply provided from a photovoltaic device, and in particular the problem of islanding. According to a first aspect of the present invention there is therefore provided a photovoltaic power conditioning circuit for providing power from a photovoltaic device to an alternating current mains power supply line, the circuit comprising: a DC input to receive DC power from said photovoltaic device; an AC output configured for direct connection to said AC mains power supply line; a DC-to-AC converter coupled to said DC input and to said AC output to convert DC power from said photovoltaic device to AC power for output onto said power supply line; and an electronic controller directly coupled to said power supply line to measure a voltage of said power supply line and a current in said supply line and to control said DC-to-AC converter responsive to said measuring.

Directly coupling the electronic controller to the power supply line facilitates monitoring of conditions on the line rather than needing to infer these from a measurement made at some earlier point in the supply of power from the PV device to the mains. Such indirect measurements risk a fault interfering with correct operation of the photovoltaic power conditioning and, in particular, of the aforementioned islanding.

In a preferred embodiment, the mains power supply voltage may be measured by making a direct connection to each of the mains power supply lines, and using a potential divider to reduce this to a level suitable for input to a controller such as a microcontroller. The current in the mains power supply line may advantageously be measured by inserting a current-sensing resistor in series with one of the supply lines and measuring the voltage across this resistor again, preferably, using a potential divider at either end of the current-sensing resistor to reduce the sensed voltages to levels suitable for input to a microcontroller.

The circuit may be used with the typical mains voltages of 110 volts and 230/240 volts or with other mains voltages and, although it is particularly suitable for supplying power to grid-mains, it may also be used to provide a direct mains supply to an appliance, for example a television.

In a preferred embodiment, the controller is configured to determine a first frequency, for the measured mains voltage, and a second frequency, of the measured mains current, and to control the DC-to-AC converter responsive to a difference between these two frequencies. The skilled person will appreciate that the frequency of the current and the frequency of the voltage will not generally be identical because of the presence of reactive loads associated with the grid itself.

The presence of such a difference in frequencies indicates that power is being supplied to a load on the mains power supply line by both the photovoltaic power conditioning circuit and by another power source connected to the mains grid. Conversely, if the two frequencies are substantially the same, this may indicate that power to the mains grid has been removed and that power supply from the photovoltaic device should also be switched off, for example by disconnecting the DC-to-AC converter from the AC output. However, it is not necessarily the case that where the two frequencies are similar, power is only being supplied from the photovoltaic device. Therefore, the controller is preferably further configured to progressively change, for example reduce, an operating frequency of the DC-to-AC converter to correspondingly change the frequency of the AC output, which may be monitored by monitoring the second frequency, that is the frequency of the output current being supplied from the circuit to the mains. Where this progressive change results in the second frequency going outside a limit without the difference between the first and second frequencies exceeding a threshold, that is, broadly speaking, where the first frequency substantially follows the second frequency as the first frequency is changed, this indicates that power is primarily being supplied from the photovoltaic power conditioning circuit, rather than from the grid mains and that, therefore, the circuit should be "islanded", for example by disconnecting the DC-to-AC converter from the AC output.

In a preferred embodiment, the above-described electronic control functions are implemented by means of a microcontroller, coupled to working memory and to stored programme memory, the stored programme memory storing processor control code to implement the above-described controller functions.

In a preferred embodiment, much of the power conditioning circuit is implemented on a single integrated circuit. More specifically, the DC-to-AC converter preferably comprises a plurality of MOSFETs and an optional, but preferable, DC-to-DC converter preceding the DC-to-AC converter comprising a plurality of IGBTs (Insulated Gate Bipolar Transistors). These may collectively be referred to as power devices, that is devices involved in the conduction of power from the PV device to the mains power supply. Such devices require drivers, such as CMOS drivers, which are generally separate from the power devices. In the case of circuits operating at relatively high voltages, good isolation between the power devices and their drivers is important. For high voltage power devices, silicon on insulator (SOI) technology is generally used (although junction isolation technology may also be employed) with vertically-integrated devices. However, this does not permit integration of the power devices and drivers because of the underlying buried oxide (BOX) layer, which inhibits connection between the two. In a preferred arrangement, therefore, the power devices of the present circuit use laterally-integrated devices such as lateral IGBTs and lateral tower MOSFETs such as LDMOSFETs (Lateral Double-diffused MOSFETs) in either CMOS or DMOS technology. This allows the (CMOS) drivers (which preferably also incorporate level shift and timing synchronisation elements) to be integrated on the same substrate as the power devices, optionally also with additional analogue circuitry, such as operational amplifiers or power factor correction and the like.

In a preferred embodiment, the circuit includes an interface for a rechargeable battery to allow power from the PV device to be supplied both to the mains and for battery-powered devices. Preferably, this interface is located after a so-called maximum power point tracking (MPPT) circuit, which aims to keep the PV device at an efficient operating point.

In a related aspect, the invention also provides a method of conditioning power from a photovoltaic device for provision to an AC mains power supply line, the method comprising: reading data for a voltage of said supply line and a current in said supply line into an electronic controller; determining a first frequency for said voltage and a second frequency for said current using said electronic controller; and conditioning said power using said electronic controller responsive to a difference between said first and second frequencies.

Preferably, the power conditioning further comprises controlling the converting to change the frequency of the current, monitoring the first and second frequencies, and ceasing to supply power where the controlling causes less than a threshold difference between the first and second frequencies.

The invention further provides a controller configured to operate in accordance with the above-described methods.

These aspects of the invention provide similar advantages to those described above with reference to the photovoltaic power conditioning circuit.

The above-described methods may be implemented using computer programme code, for example on a carrier medium such as a disk, or programmed memory such as read-only memory (firmware) or on an optical or electrical signal carrier. Code to implement the controller may alternatively comprise code for a hardware description language, such as Verilog (trademark), VHDL or SystemC.

These and other aspects of the invention will now be further described, by way of example only, with reference to the accompanying figures in which:

BRIEF DESCRIPTION OF THE DRAWINGS

FIGS. 2a and 2b show, respectively, a controller-to-grid interface, and a comparator and associated waveforms for the controller of FIG. 2a;

DETAILED DESCRIPTION

Figure 1:
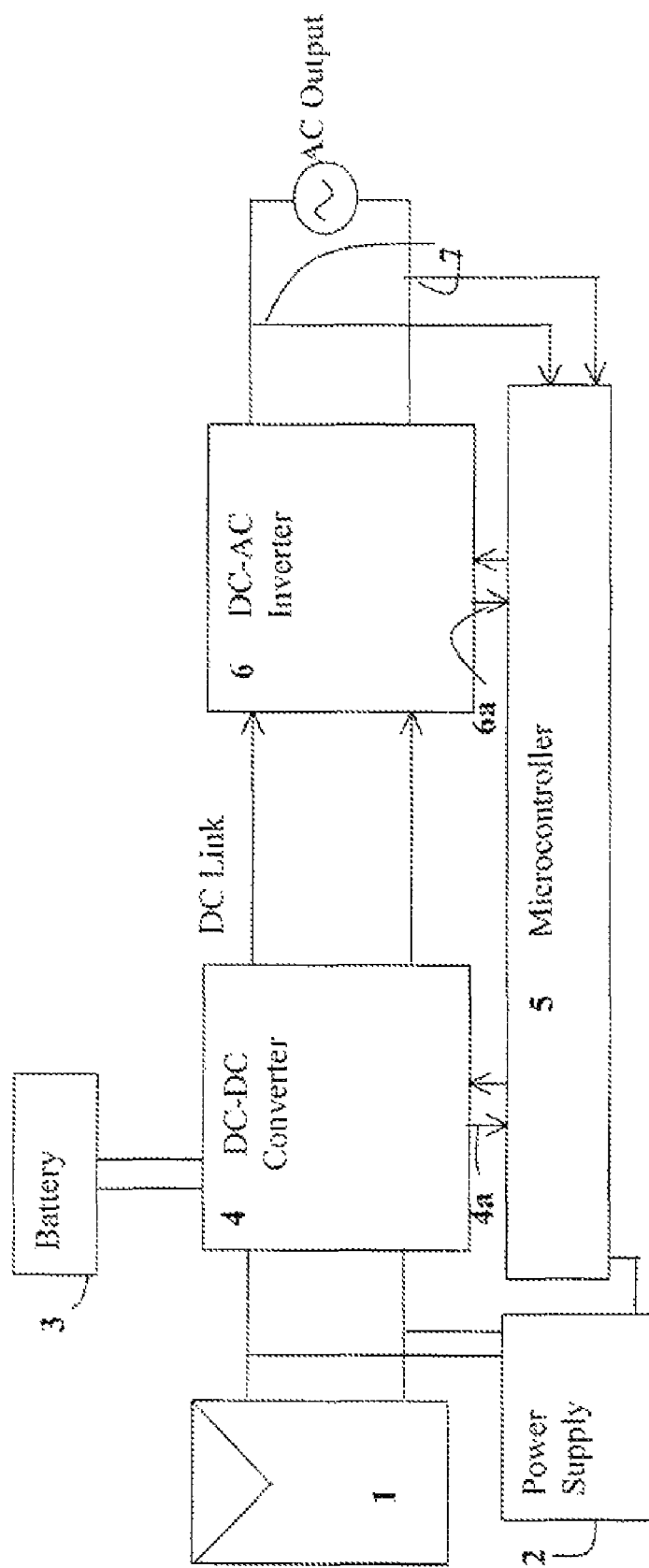
FIG. 1 shows a block diagram of photovoltaic power supply system according to an embodiment of the present invention.

Referring to FIG. 1 this shows an overall block diagram of a grid-connected photovoltaic inverter and battery controller. The photovoltaic module is shown as object 1 in FIG. 1, which is connected to the DC to DC converter. The 5V rail for the microcontroller is generated using the power supply (2), which takes the input directly from the photovoltaic module. The microcontroller is connected to the DC-DC converter 4, DC-AC converter 6 and the output 7. Depending on the condition that the controller senses at 7 point it varies the control of the power conditioning blocks via control connections 4a and 6a accordingly. The illustrated configuration is also designed to charge a battery 3, shown connected from the DC-DC converter block.

Figure 2A:
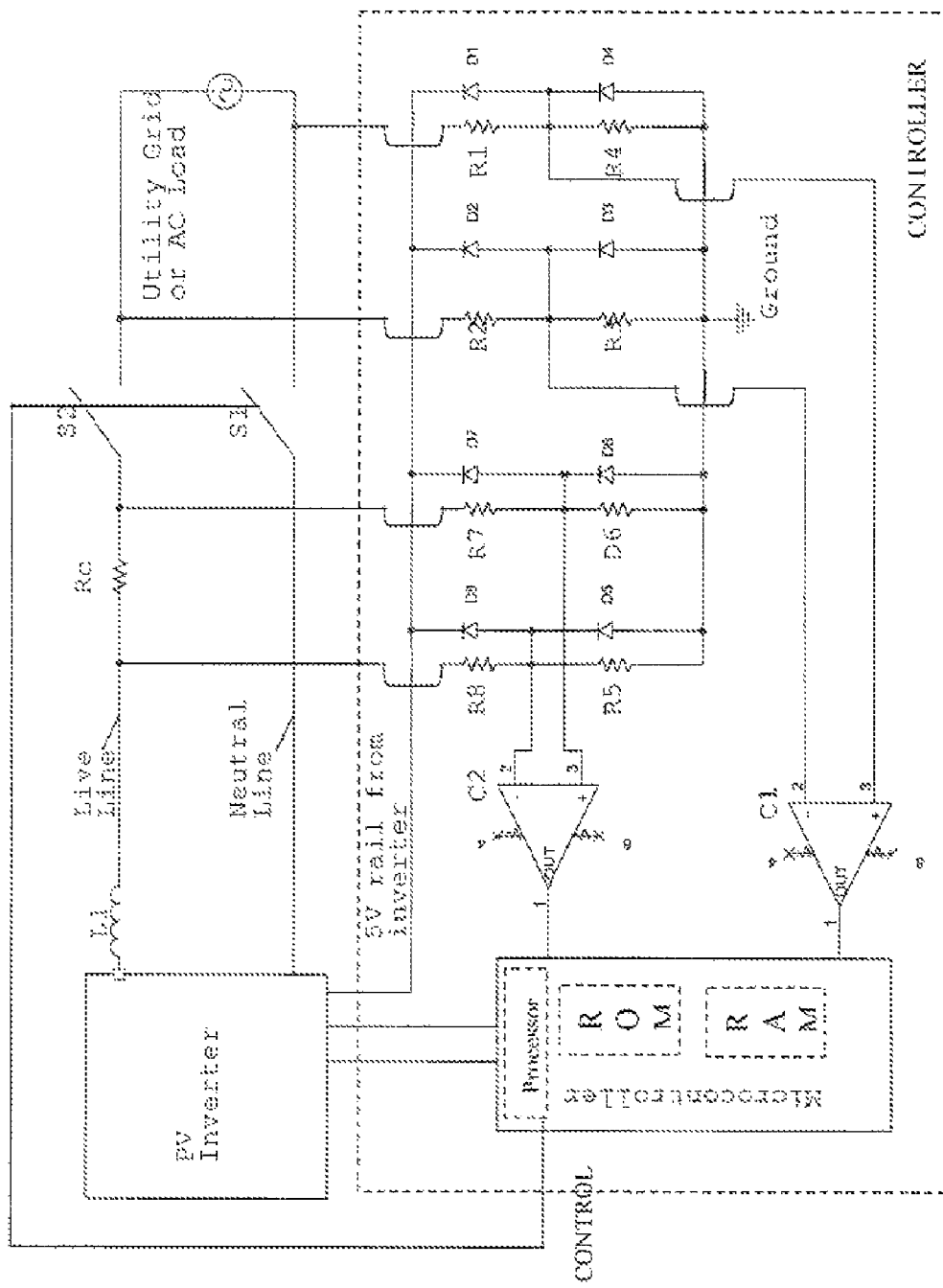

FIG. 2a shows an example of microcontroller to grid interface configuration. The figure shows how the PV inverter is connected to the mains and shows the configuration of the feedback to inverter via the microcontroller. The microcontroller is used to monitor the power quality of the inverter and the grid interface. This is done by monitoring and controlling the magnitude, phase and frequency of both the current and voltage at the point of connection of the inverter and the grid. The grid is a high voltage/current (typically, 240 V AC) supply or load whereas the microcontroller is a low power device (power supply of typically 5V).

R1 through R8 are potentiometer resistors. These are used to adapt the high line voltages. In one embodiment the upper resistors are 2 MΩ whereas the lower ones are either 10 KΩ or 40 KΩ. Rc is a current sensing resistor which in one embodiment has a value of approximately 2Ω. D1 through D8 are protection diodes. These diodes ensure that the connection point of each pair of resistors does not attain voltages over the supply voltage labelled above. The result of this is that the comparators C1, C2, and the microcontroller are protected from the high voltages and currents present in the power lines, live and neutral. C1 and C2 further buffer the magnitude and frequency of the current and voltage signals coming from the potential dividers, before connection to the microcontroller.

Figure 2B:
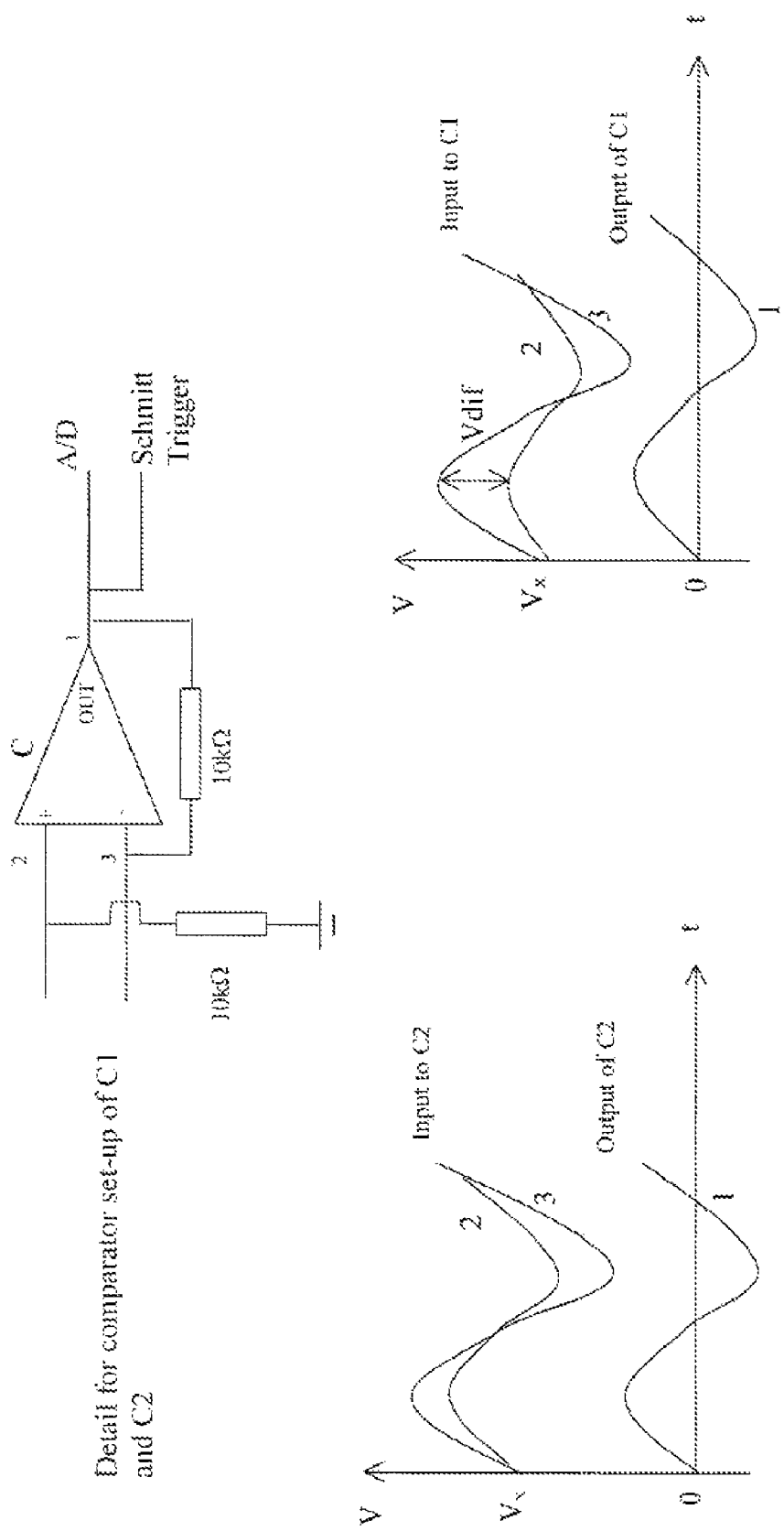

FIG. 2b shows details for a comparator and also input and output waveforms for comparators C1 and C2. The comparator has two inputs (−/+) inverting and non-inverting. Two resistors, one in feedback loop and the other grounded, are used to configure the comparator in an amplifier mode. The output is connected to an onboard microcontroller schmitt trigger and an A/D converter. The two inputs to the comparator are differential and the resultant output from the comparator is no longer floating but zero centred output voltage. For comparator C1 the voltage from the live and neutral lines, which are floating and have a fixed 110V AC or 240V AC magnitude difference, are fed into the comparator. For comparator C2 the voltage difference is due to the voltage drop across the resistor Rc. The frequency of the signals input to the comparators is substantially the same for each case. This output is processed in two ways. It is sampled using an A/D converter on the microcontroller, which allows the frequency of the signals to be calculated. The same output from the comparator is also sent to a Schmitt trigger, which allows the magnitude of the signals to be established.

Figure 3:
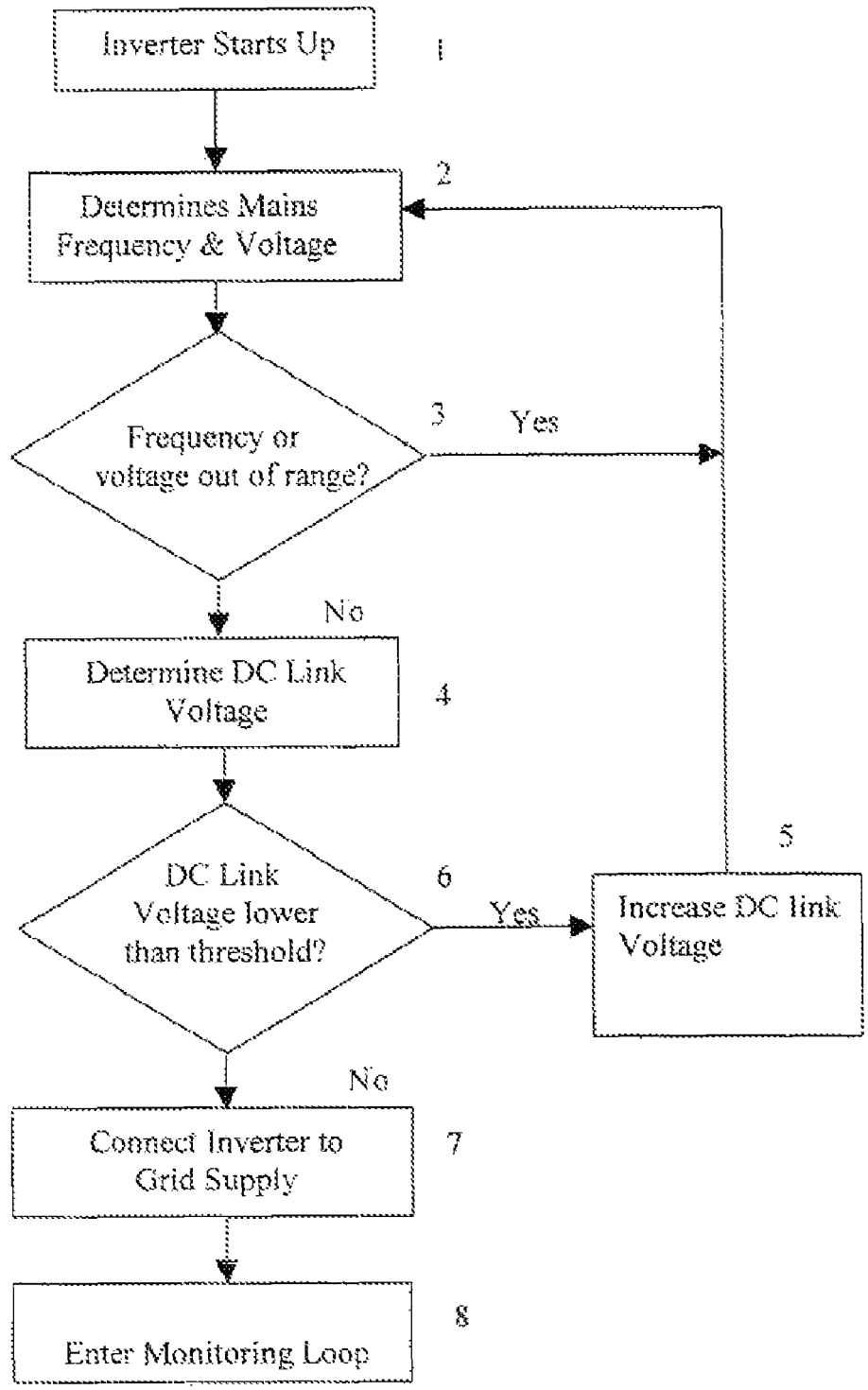
FIG. 3 shows a flow diagram of an inverter operation sequence.

FIG. 3 shows the inverter operation sequence before grid connection. Before the inverter connects or reconnects, by closing switches S1 and S2 (shown in FIG. 2a), a number of conditions are to be determined and then checked to be within the required limits. The flow diagram in FIG. 3 shows steps that are performed by the inverter prior to connection. At the time of the microcontroller power-up (step 1), the inverter determines the frequency and voltage of the grid supply (step 2). If the frequency or voltage is found to be outside the desired range (step 3), the inverter stays unconnected in wait mode. At fixed intervals it checks the grid-supply (step 2) to establish if the supply has gone back to normal condition. In the case in which the grid supply voltage and frequencies are found to be desirable, the inverter then checks the DC link voltage to evaluate if it is sufficient to enable connection (step 4). If the DC link voltage happens to be below threshold, the inverter would step the voltage up until threshold is attained (step 5). The DC Link voltage may be varied in two ways. A multi-tap transformer or a boost step up circuit with variable duty cycle can be used. Once all conditions are checked and met, the switches S1 and S2 are closed, which is controlled by the microcontroller and the inverter is connected to the grid (step 7). The system then continues to monitor its operation in case of any abnormal condition, and disconnects if such abnormality prevails. Some of the conditions that are constantly monitored are discussed later (step 8).

Figure 4:
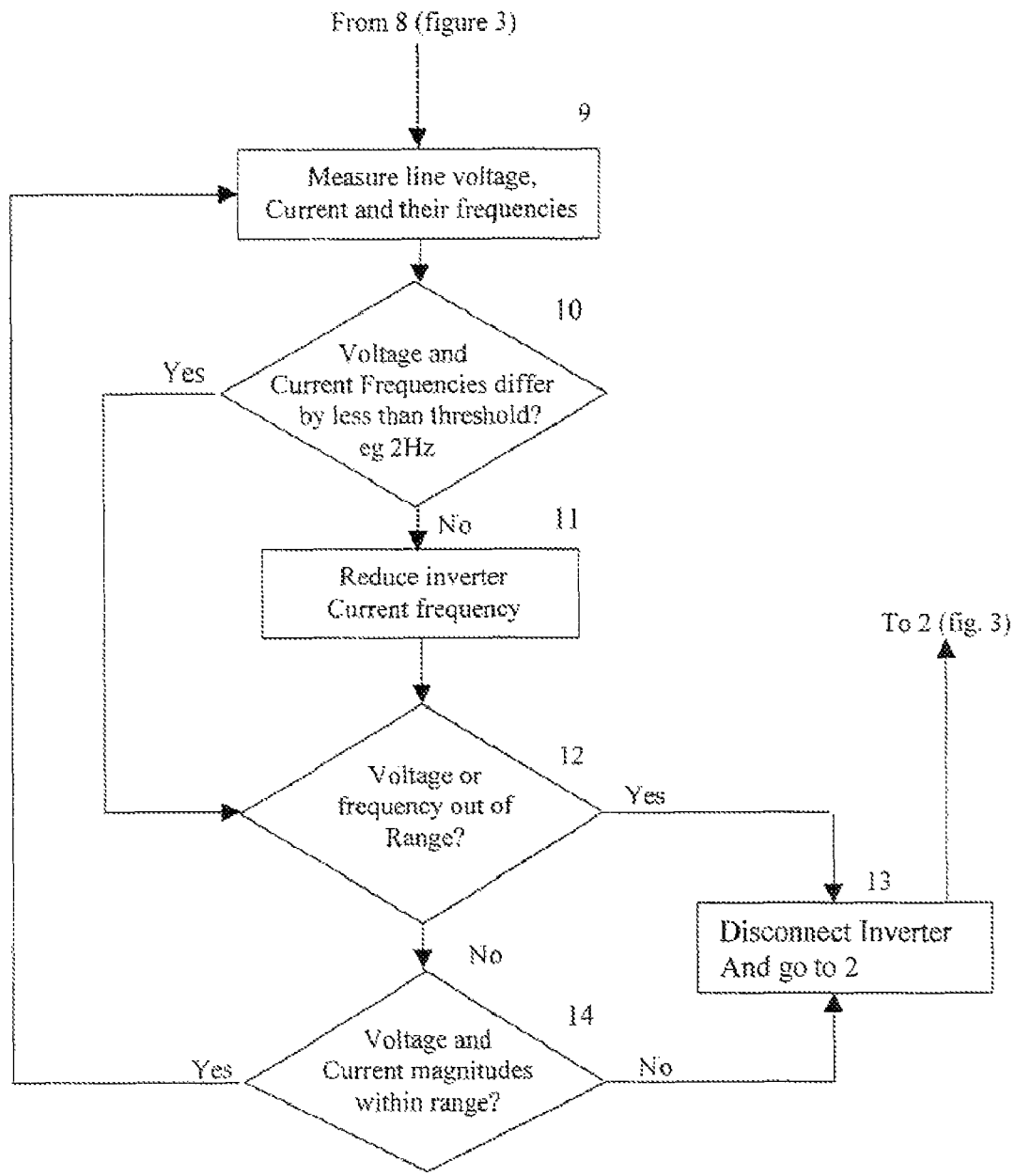
FIG. 4 shows a flow diagram of a grid-connection monitoring process.

FIG. 4 shows the flow diagram of the sequence steps involved in the monitoring process, which enable the system to disconnect if conditions occur that may adversely affect operation of the overall system. Some of the abnormal conditions are described below. Once the inverter has been connected, voltages, currents and their frequencies have to be observed (step 9). The frequencies are then compared to check if they are less than the required threshold (step 10). If so then the voltage is checked to find out if is out of the required range (step 12), if it is then the PV inverter is disconnected and returns to sequence before grid-connection (FIG. 3). If the current and voltage frequencies are not within the required threshold (step 10) then the current frequency is reduced (step 11) and then the voltage frequency is checked (step 12). If the voltage is found to be in range (step 12) then the current/voltage magnitudes are checked to establish if they are in the required range (step 14). If not then the PV inverter is disconnected (step 13) and enters the sequence of FIG. 3. If the magnitudes are within the necessary range then the PV inverter remains connected and follows through the loop periodically.

Some of the abnormal conditions that may occur in the system include over-current, over-voltage, under-voltage, over-frequency, under-frequency and islanding. The inverter temporarily disconnects when any of these conditions occur by using the above method. The abnormal current, voltage or voltage conditions may be a result of a faulty condition in the system, an overload or an under-load. Over-current is said to occur when more current than normal flows in power lines. Under-voltage is a state in which the line voltage dips below the lower set threshold. Over-voltage is a state in which the line voltage shoots above the upper set threshold. Over-frequency is said to occur when the line frequency goes above the upper threshold. Under-frequency is said to occur when the line frequency goes below the lower threshold.

Figure 5:
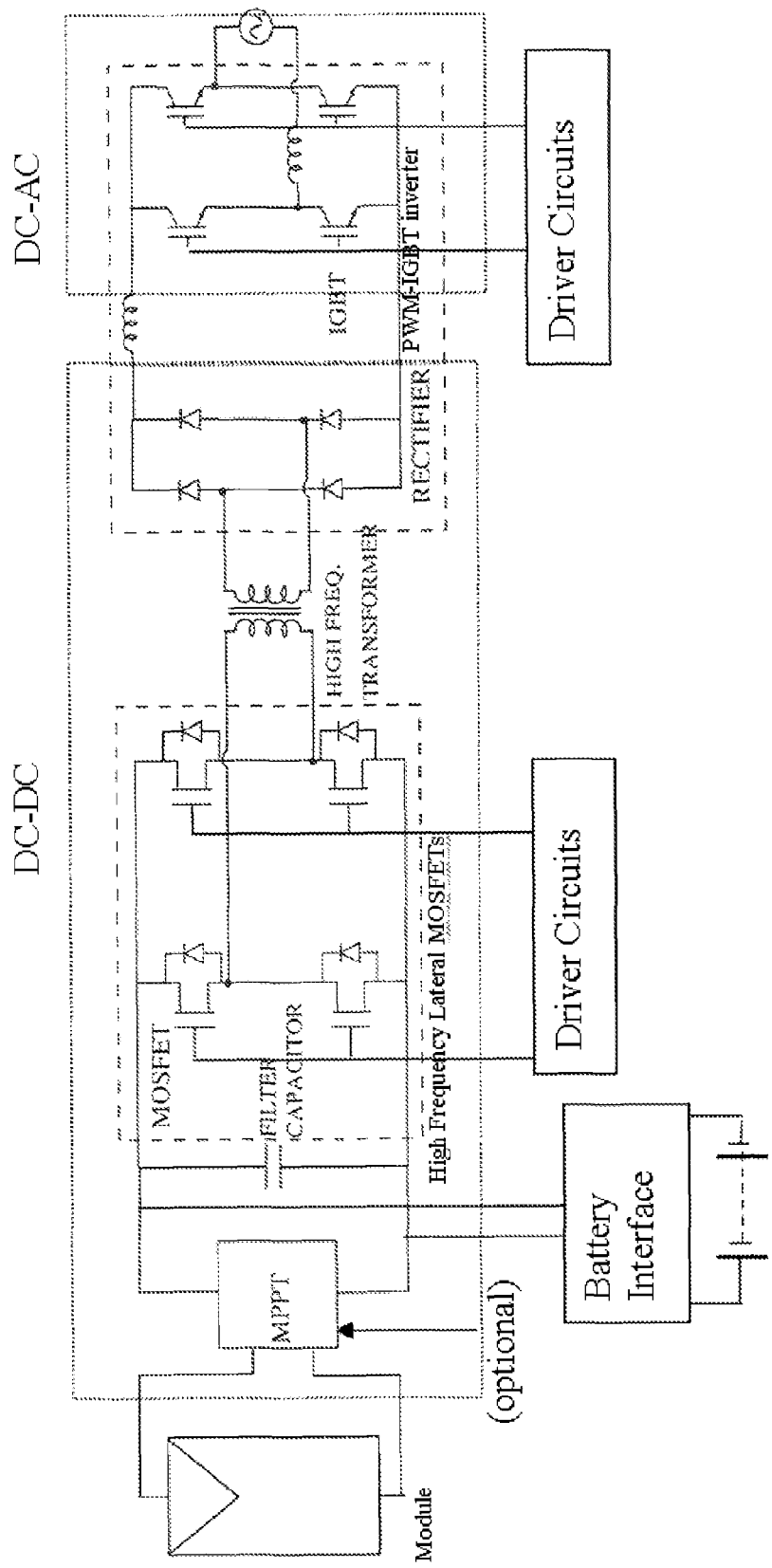
FIG. 5 shows a circuit diagram of a photovoltaic inverter for use with the system of FIG. 2.

FIG. 5 shows a circuit configuration for the PV inverter. A standard photovoltaic panel feeds into the inverter. The microcontroller is not shown but interfaces to the MPPT (maximum power point tracking), battery interface and the driver circuits. The MPPT is a circuit configuration (known to those skilled in the art) controlled by the microcontroller to allow the maximum power from the photovoltaic module to be transferred into the inverter. Another circuit preferably included at this stage is the battery interface circuit, which allows a standard battery to be charged from module. The filter capacitor ensures a smooth supply to the lateral mosfet full-bridge. The lateral mosfets are switched at high frequency (30 KHz) to produce a square wave output. This is then stepped up to high voltage by the high frequency transformer. The rectifier is used to produce a high voltage DC link that is connected to a PWM (Pulse Width Modulated) switched lateral IGBT (Insulated Gate Bipolar Transistor) inverter. The output produced is the AC mains voltage. The sections of the circuit that are monolithically integrated onto a single silicon chip are the high frequency lateral mosfets full bridge, rectifier stage, the lateral IGBT inverter stage and the associated driver circuits.

Figure 6:
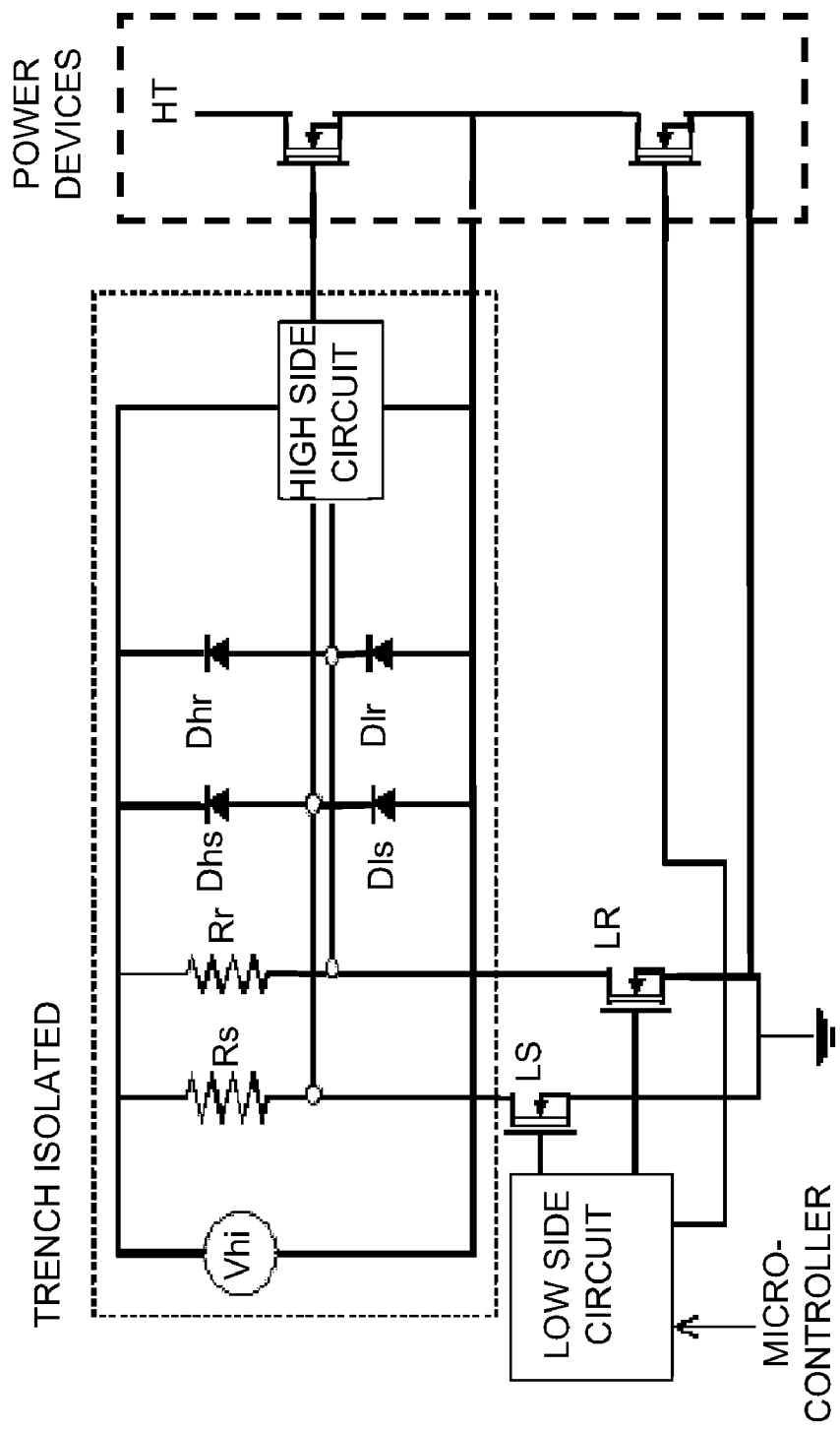
FIG. 6 shows a half-bridge driver circuit for the inverter of FIG. 5.

FIG. 6 shows the driver circuit, which uses a pulsed common source level shifter scheme, and is a standard method for driving half bridges. The low side circuit converts the signal from the microcontroller to three signals. Firstly it produces the inverse of the input signal and introduces dead time between the two signals. The inverse is connected to the low side power device. The actual input signal is then deconstructed into a rising and a falling edge pulse. These then switch the level shifting mosfets LS and LR at the appropriate times. When this happens a voltage is developed across the resistors Rs and Rr. This voltage triggers the high side circuit, which comprises an input stage for rejecting spurious transients and an SR (set-reset) latch circuit. This produces the appropriate gating signal for the high side device. Also due to the fact that the high side is isolated it allows the high side circuit to float to the high side voltage. Also comprised in the high side and low side circuits are the MOS gate drivers comprising a string of sized CMOS inverters.

Figure 7:
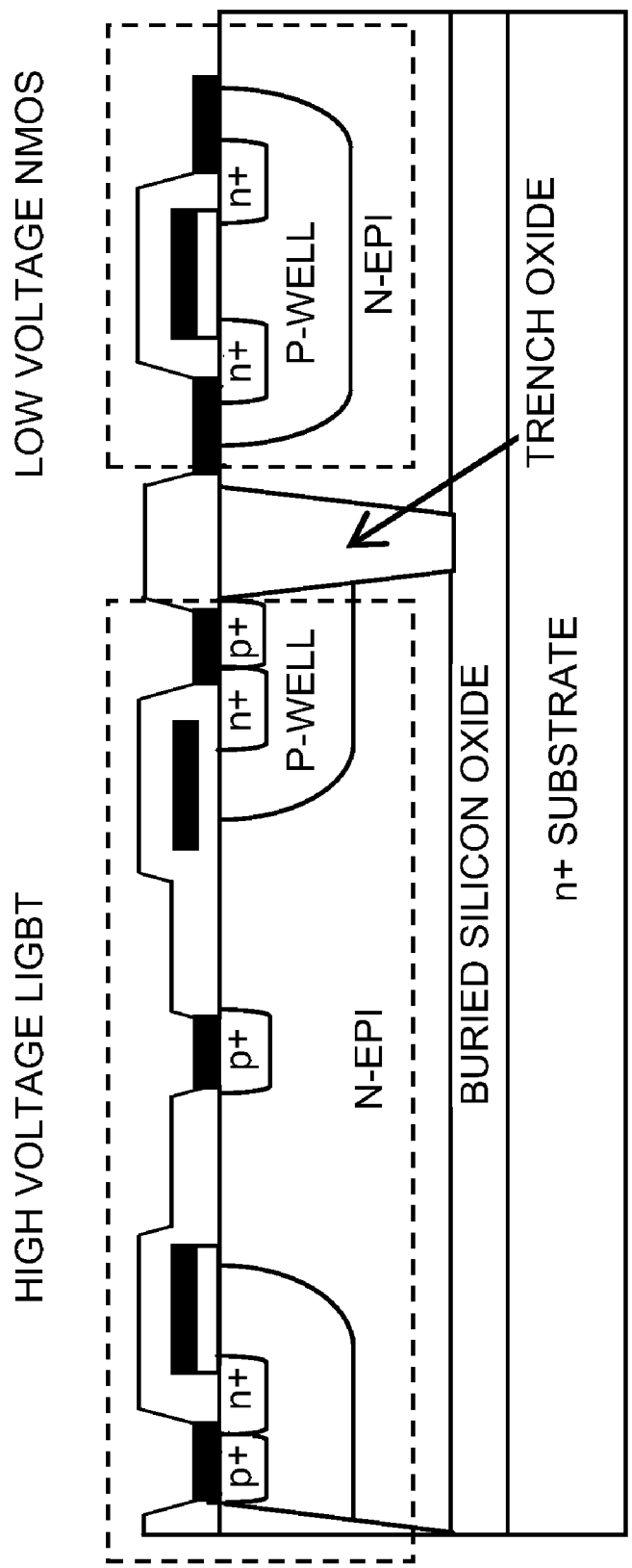
FIG. 7 shows a cross-sectional view of a Lateral IGBT alongside an NMOS device.

FIG. 7 shows a cross-sectional view of a Lateral IGBT alongside an NMOS device. Preferably the PV inverter comprises a monolithic circuit with its active components fabricated on a single semiconductor substrate. In order to integrate the lateral mosfets, LIGBTs, and high voltage rectifier stage, there are two main requirements: a suitable fabrication process and an isolation process. Isolation is required in order that power devices do not interfere with each other and with the low voltage CMOS devices. The isolation in FIG. 7 can be seen to be provided by a vertical trench, which reaches down to the buried oxide. As will be understood by those skilled in the art, a suitable fabrication process may be established by optimising a CMOS process to allow the integration of all the devices, with routine but extensive computer simulations. In particular, the common layers such as P-well, N-well and N-drift are preferably optimised in order to allow the operation of the devices to a satisfactory degree. No doubt many other effective alternatives will occur to the skilled person and it should be understood that the invention is not limited to the described embodiments but encompasses modifications within the scope of the claims.

What is claimed is:

1. A photovoltaic power conditioning integrated circuit for providing power to an AC mains power supply line from a photovoltaic device, the integrated circuit comprising:
    a DC power input to receive DC power from said photovoltaic device;
    a first DC-to-DC power conversion stage coupled to said DC power input to convert a first DC voltage from said photovoltaic device to a second, higher DC voltage, said first DC-to-DC power conversion stage comprising a first plurality of power MOSFET devices;
    a second DC-to-AC power conversion stage having an input coupled to an output of said first DC-to-DC power conversion stage to convert said second, higher DC voltage to an AC voltage for said AC mains power supply line, said second DC-to-AC power conversion stage comprising a second plurality of power semiconductor devices;
    an AC voltage output coupled to an output of said second DC-to-AC power conversion stage;
    a first driver circuit coupled to drive said first DC-to-DC power conversion stage; and
    a second driver circuit coupled to drive said second DC-to-AC power conversion stage;
    wherein said integrated circuit has a common substrate on which are fabricated said first DC-to-DC power conversion stage including said first plurality of power MOSFET devices, said second DC-to-AC power conversion stage including said second plurality of power semiconductor devices, said first driver circuit and said second driver circuit;
    wherein said integrated circuit is a silicon-on-insulator integrated circuit having a buried oxide layer, and wherein said first driver circuit and a portion of said first DC-to-DC power conversion stage are unconnected and electrically isolated from said second DC-to-AC power conversion stage and from said second driver circuit, wherein said electrical isolation comprises a dielectric filled trench on said integrated circuit extending down to contact said buried oxide layer.

2. A photovoltaic power conditioning integrated circuit as claimed in claim 1 wherein said second plurality of power semiconductor devices comprises a plurality of power bipolar semiconductor devices, and wherein said integrated circuit is fabricated using a process optimized for fabrication of a combination of said power MOSFET devices and said power bipolar semiconductor devices.

3. A photovoltaic power conditioning integrated circuit as claimed in claim 2 wherein said plurality of power bipolar semiconductor devices comprises a plurality of IGBTs.

4. A photovoltaic power conditioning integrated circuit as claimed in claim 2 wherein said power MOSFET devices and said power bipolar semiconductor devices comprise lateral power bipolar semiconductor devices.

5. A photovoltaic power conditioning integrated circuit as claimed in claim 1 wherein said first DC-to-DC power conversion stage comprises a transformer drive connection to provide an AC power output to a transformer, and a transformer input connection to receive an AC power input from said transformer, wherein said first plurality of power MOSFET devices are coupled between said DC power input and said transformer drive connection, and further comprising at least one rectifier coupled between said transformer input connection and said DC output of said first DC-to-DC power conversion stage, and wherein said portion of said first DC-to-DC power conversion stage electrically isolated from said second DC-to-AC power conversion stage comprises said first plurality of power MOSFET devices.

6. A photovoltaic power conditioning integrated circuit as claimed in claim 5 wherein said at least one rectifier is not electrically isolated from said second DC-to-AC power conversion stage.

7. A photovoltaic power conditioning integrated circuit as claimed in claim 1 wherein said first driver circuit comprises a voltage level shift circuit for driving at least one of said plurality of power MOSFET devices and wherein said second driver circuit, electrically isolated from said first driver circuit, is configured to drive at least one of said second plurality of power semiconductor devices without an intermediate said voltage level shift circuit.

8. A photovoltaic power conditioning integrated circuit as claimed in claim 7 wherein one or both of said first and second driver circuits comprises a string of CMOS inverters.

9. A photovoltaic power conditioning integrated circuit for providing power to an AC mains power supply line from a photovoltaic device, the integrated circuit comprising:
    a DC power input to receive power from said photovoltaic device;
    a first DC-to-DC power conversion stage coupled to said DC power input to convert a first DC voltage from said photovoltaic device to a second, higher DC voltage, said first DC-to-DC power conversion stage comprising a first plurality of lateral power MOSFET devices;
    a second DC-to-AC power conversion stage having an input coupled to an output of said first DC-to-DC power conversion stage to convert said second, higher DC voltage to an AC voltage for said AC mains power supply line, said second DC-to-AC power conversion stage comprising a second plurality of lateral power bipolar semiconductor devices;
    an AC voltage output coupled to an output of said second DC-to-AC power conversion stage;
    a first control input to receive a first control signal from a controller;
    a first driver circuit coupled to said first control input and to said first DC-to-DC power conversion stage, said first driver circuit controlling switching of said plurality of lateral power MOSFET devices in response to said first control signal from said controller;
    a second control input to receive a second control signal from said controller; and
    a second driver circuit coupled to drive said second control input and to said second DC-to-AC power conversion stage, said second driver circuit controlling switching of said plurality of lateral power bipolar semiconductor devices in response to said second control signal from said controller;
    wherein said integrated circuit is a silicon-on-insulator integrated circuit having a buried oxide layer, and wherein said first driver circuit and a portion of said first DC-to-DC power conversion stage are unconnected and electrically isolated from said second DC-to-AC power conversion stage and from said second driver circuit, wherein said electrical isolation comprises a dielectric filled trench on said integrated circuit extending down to contact said buried oxide layer.

10. A photovoltaic power conditioning integrated circuit as claimed in claim 9 wherein said plurality of lateral power bipolar semiconductor devices comprises a plurality of IGBTs.

11. A photovoltaic power conditioning integrated circuit as claimed in claim 9 wherein said first driver circuit comprises CMOS devices and a voltage level shift circuit for driving at least one of said plurality of lateral power MOSFET devices and wherein said second driver circuit, electrically isolated from said first driver circuit, comprises CMOS devices and is configured to drive at least one of said second plurality of lateral power bipolar semiconductor devices without an intermediate said voltage level shift circuit.

12. A photovoltaic power conditioning integrated circuit as claimed in claim 9 wherein said first DC-to-DC power conversion stage comprises a transformer drive connection to provide an AC power output to a transformer, and a transformer input connection to receive an AC power input from said transformer, wherein said first plurality of lateral power MOSFET devices are coupled between said DC power input and said transformer drive connection, and further comprising at least one rectifier coupled between said transformer input connection and said DC output of said first DC-to-DC power conversion stage, and wherein said portion of said first DC-to-DC power conversion stage electrically isolated from said second DC-to-AC power conversion stage comprises said first plurality of lateral power MOSFET devices.

* * * * *